United States Patent [19]
Robinson

[11] Patent Number: 5,219,713
[45] Date of Patent: Jun. 15, 1993

[54] MULTI-LAYER PHOTORESIST AIR BRIDGE FABRICATION METHOD

[75] Inventor: Gerald D. Robinson, Dayton, Ohio

[73] Assignee: Rockwell International Corporation, Seal Beach, Calif.

[21] Appl. No.: 628,816

[22] Filed: Dec. 17, 1990

[51] Int. Cl.$^5$ .............................................. G03C 5/58
[52] U.S. Cl. .................................. 430/314; 430/313; 430/315; 437/229; 437/231
[58] Field of Search ............... 430/314, 315, 313, 312; 437/229, 231; 427/99, 124

[56] References Cited

U.S. PATENT DOCUMENTS

| | | | |
|---|---|---|---|
| 3,331,125 | 7/1967 | McCusker | 427/124 |
| 3,932,226 | 1/1976 | Klatskin et al. | 437/205 |
| 4,289,846 | 9/1981 | Parks et al. | 430/314 |
| 4,601,915 | 7/1986 | Allen et al. | 430/315 |
| 4,642,259 | 2/1987 | Vetanen et al. | 430/314 |

FOREIGN PATENT DOCUMENTS

| | | | |
|---|---|---|---|
| 54-48181 | 4/1979 | Japan | 430/315 |
| 57-104665 | 6/1982 | Japan | 430/314 |

Primary Examiner—Marion E. McCamish
Assistant Examiner—Christopher D. RoDee
Attorney, Agent, or Firm—Wilfred G. Caldwell

[57] ABSTRACT

The method of constructing an air bridge on a substrate between spaced apart conductors on the substrate with the bridge spanning the distance between the conductors, by using PMGI to build a bridge pad on the substrate; using PMMA to build a bridge pattern over the pad with the ends of said conductors extending into said pattern; depositing titanium and gold over said pad within said pattern by directing the titanium and gold into said pattern onto said pad and conductor ends using relative motion between the substrate and the titanium and gold; and removing the PMGI and PMMA.

7 Claims, 3 Drawing Sheets

MULTI-LAYER PHOTORESIST AIR BRIDGE FABRICATION METHOD

BACKGROUND OF THE INVENTION

1. Field of the Invention

This invention relates to the making of air bridges using multi-level photoresist and metallization in lieu of any electro-plating method.

2. Prior Art

Millimeter wave (mmW) and monolithic Microwave Integrated Circuits (MMIC) incorporate HBT (heterojunction bipolar transistor) and HEMT (high electron mobility transistor) devices which require low capacitance, low inductance, high Q air bridge interconnections, not available heretofore.

Prior art air bridges are fabricated using electro-plating procedures. They require multiple photoresist applications and plating media metallization. The plating media must be removed following the plating process.

These procedures are time consuming and subject the circuits to be processed to harsh chemical plating and chemical etching environments which can damage delicate devices.

In addition, plated gold, which is the plating metal used for air bridges, has low conductivity, necessitating thick metal thicknesses to insure high quality crossovers.

SUMMARY OF THE INVENTION

Compatible multi-layer photoresist techniques eliminate the foregoing problems associated with electro-plating, as disclosed herein.

A poly-(dimethylglutarimide), hereinafter called PMGI, layer is established and delineated on a substrate to form a temporary support-type mold or pad for each air bridge. It is exposed to deep ultra-violet (~ 248 mm) prior to development.

Following development of the PMGI, the photoresist is removed and the PMGI is reflowed to avoid sharp corners or edges.

A layer of polymethylmethacrylate, hereinafter called PMMA, is spun on and delineated temporarily to define the bridge pattern between conductors to receive the bridge ends. It is also exposed to deep ultra-violet prior to developing.

The PMMA is actually overdeveloped until an undercut is formed beneath the photoresist edges in the PMMA of approximately 0.5 to 2 microns above the conductors to receive the bridge ends.

Next, the wafer is mounted on an evaporation tilt fixture with the long bridge dimension being perpendicular to the tilt axis if the bridges all run in one direction. If the bridges are both horizontal and vertical, the wafer is mounted at a 45° angle to the tilt axis. Then, titanium-gold is deposited, using an E-beam source, while the fixture is continuously tilted through a positive 20° angle and a negative 20° angle.

Finally, the photoresist and PMMA are dissolved, followed by the dissolving of the PMGI.

DETAILED DESCRIPTION OF A PREFERRED EMBODIMENT

Figure 1:
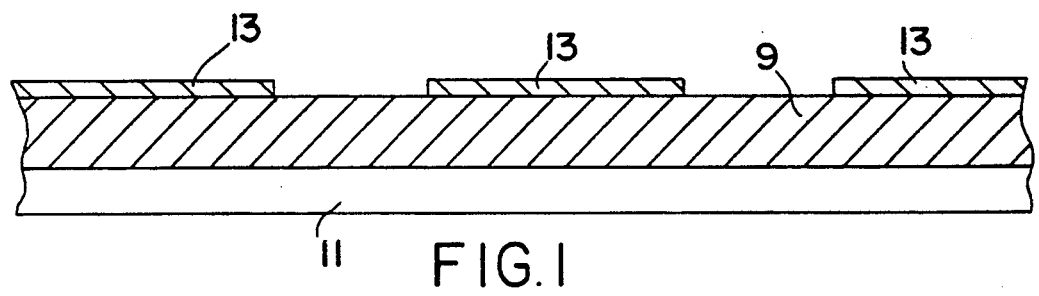
FIG. 1 shows multiple layers of PMGI spun-on the substrate with baking following each layer, photoresist spun-on, followed by baking and defining of the air bridge.

In FIG. 1, a layer 9 of PMGI is spun onto the semiconductor substrate 11 (GaAs, In P, etc.) at about 4,000 rpm for approximately 40 seconds.

Secondly, the PMGI layer 9 and substrate 11 are baked at about 190° C. for up to 30 minutes.

Thirdly, the first two steps are repeated to establish approximately 2 micron thickness for the PMGI layer 9. Each additional layer will increase the total thickness by about 0.9 microns per layer.

In the fourth step, positive photoresist Microposit ® 1400 ®-27 positive photoresist (a product of Shipley, 1200 Washington Street, Newton, Mass. 02162), is spun on at about 4,000 rpm for about 40 seconds.

In the fifth step, the substrate 11 with these layers is baked at about 90° C. for approximately 30 minutes.

The sixth step is to define the air bridge pad 15 by the photoresist 13, using contact, proximity or projection lithography.

After completing the structure of FIG. 1, the next step, which is the seventh step in the process, is to deep ultra violet flood to expose the PMGI layer 9 at 10 milliwatts per square centimeter at approximately 248 nanometers for about 10 minutes. This sensitizes the PMGI so it will dissolve away during development.

Then, in step 8, the PMGI is developed to form the finished pad 15. Developing is done on a spinner at about 500 rpm, using Microposit ® SAL ® 101 developer (a product of Shipley, 1200 Washington Street, Newton, Mass. 02162). This results in the structure shown in FIG. 2.

Figure 2:
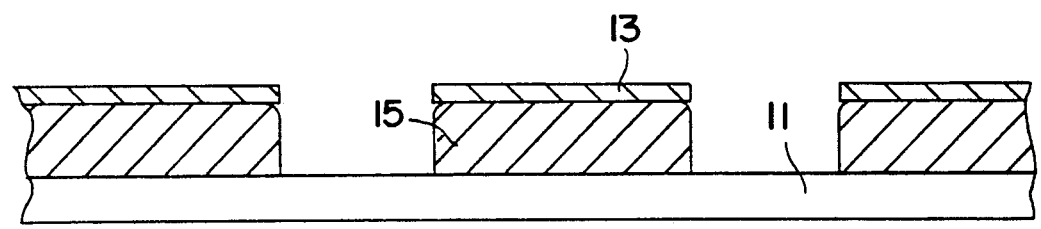
FIG. 2 shows FIG. 1 after deep ultra-violet exposure and development of the PMGI.

In step 9, the photoresist 13 of FIG. 2 is removed using acetone, followed by conventional isopropyl alcohol rinse.

The next step is 9A, and it is very significant to the final product. The PMGI is reflowed by having the wafer placed into a dish for heating in, e.g., a 250° C. oven for 10 to 60 seconds - sufficient to allow the PMGI to round the corners and taper the edges by exceeding its transition temperature. The time here may be adjusted for the optimum profile and even a hot plate may substitute for the oven. That is the reason for the "pillow" shape of the finished pad 15', shown in FIG. 3.

The 10th step is to spin on conventional PMMA, 9%, 950K at 4,000 rpm for 40 seconds. The PMMA layer is shown at 17 in FIG. 3.

The 11th step is to bake the wafer 11 with the PMMA layer 17 at about 190° C. for about 30 minutes.

The 12th step is to repeat the tenth and eleventh steps.

The 13th step is to spin on positive photoresist 1400-27 at approximately 4,000 rpm for about 40 seconds.

The 14th step is to bake the substrate 11 with the above layers at 90° C. for about 30 minutes.

The 15th step is to define the bridge pattern, i.e., slot-like opening 19. (FIG. 3) using contact, proximity or projection lithography.

Figure 3:
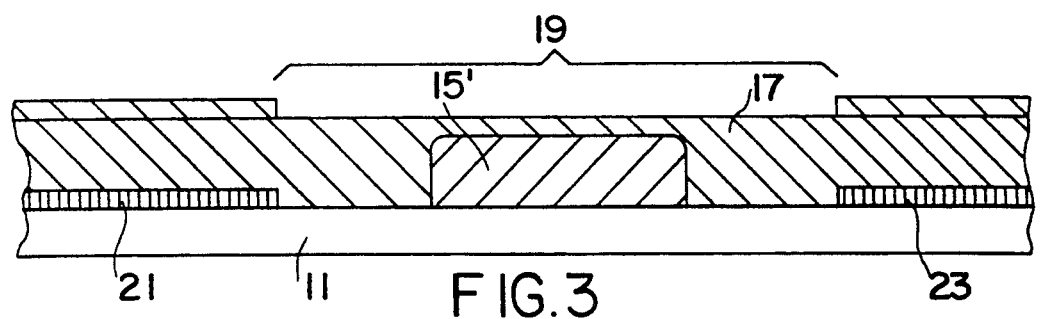
FIG. 3 shows FIG. 2 after the PMGI has been reflowed to remove sharp corners and edges, PMMA has been spun on, baked, and these two steps repeated, a photoresist has been spun on and baked, developed, and the bridge pattern has been defined by an opening in the photoresist.

It should be noted that the conductors to be joined by the bridge are visible in FIG. 3 at 21 and 23.

Figure 4:
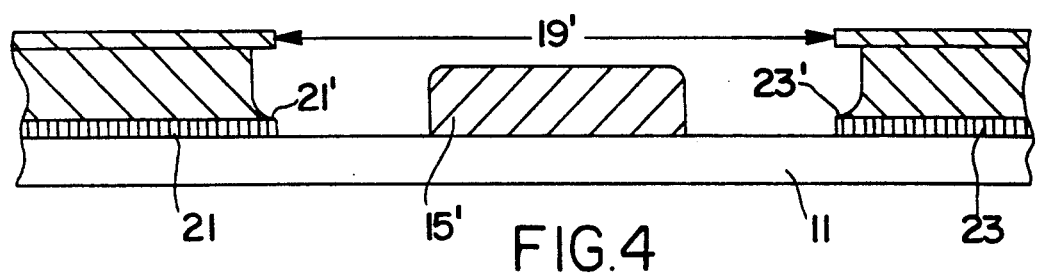
FIG. 4 shows FIG. 3 after ultra violet exposure, and development of the PMMA, including over-development until sufficient undercut has been obtained.

In the 16th step, the structure of FIG. 3 is flooded with deep ultra violet to expose the PMMA for about 5 minutes at 10 milliwatts per centimeter squared at approximately 248 nanometers. This sensitizes the PMMA so it will dissolve away when developed. (FIG. 4)

In step 17, the PMMA is developed using chlorobenzene (see opening 19'). However, it is over-developed until approximately ½ to 2 micrometer undercut is obtained, as shown by the spacing 21' and 23' on the conductors 21 and 23.

The purpose of the undercuts is to ensure that when the bridge is formed by depositing titanium gold through the slot or opening 19' while continuously tilting the opening 19' back and forth in front of the source of bridge metal, that no fingers will be formed at the bridge extremes due to making the undercut equal the angle of tilt.

Figure 5:
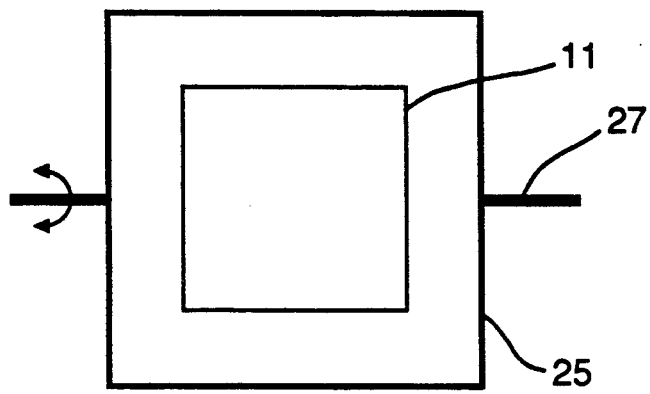
FIG. 5 shows the wafer of FIG. 4 mounted on an evaporation tilt fixture with the long bridge dimension being perpendicular to the tilt axis.

Thus, in FIG. 5, the wafer 11 is mounted on the evaporation tilt fixture 25, for step 18, such that the long bridge dimension is perpendicular to the tilt axis 27 for the bridges oriented in the same direction or at a 45° angle to the tilt axis if bridges are both horizontal and vertical.

Figure 6:
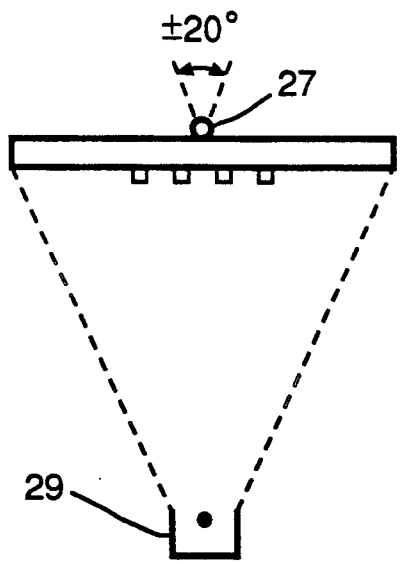
FIG. 6 shows the wafer of FIG. 5 receiving E-beam deposited titanium gold while being continuously tilted through a +20° and a −20° angle; and, FIG. 7 shows the bridge, after the PMMA and PMGI have been dissolved, connected to the conductors.

Step 19 is to deposit the titanium gold in a ratio of 300Å to 20,000Å by tilting the wafer 11 continuously through positive and negative 20° angles (as shown in FIG. 6) above the E-beam source 29 of FIG. 6 for directional metal build-up.

Finally, the 20th step is to dissolve the photoresist 13', using warm acetone, and to dissolve the PMGI, using warm (100° C.) SAL 101.

Figure 7:
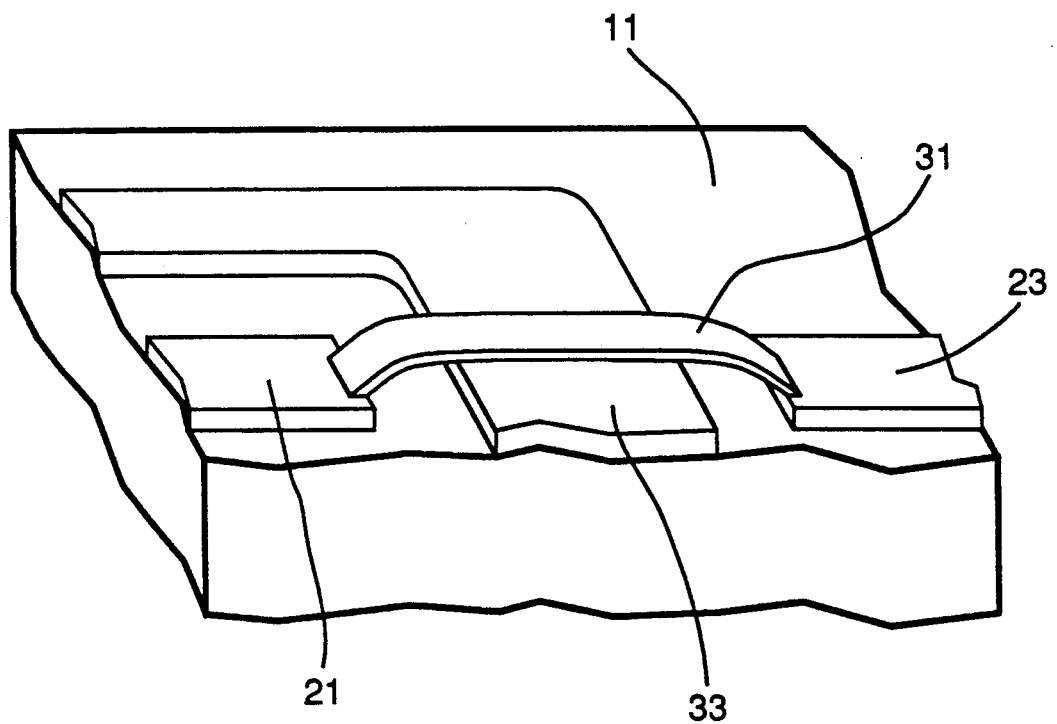

FIG. 7 shows the finished air bridge 31 on wafer or chip 11 spanning the distance between conductors 21 and 23 to extend a conductive path over element 33. The bridges may have varying lengths and heights, and by way of example, 28 bridge 31 may be 20 to 30 microns in length. The preferred thickness of 20,000Å of gold (with 300Å of titanium) provides very low resistance.

What is claimed is:

1. The method of constructing an air bridge on a substrate electrically interconnecting a first conductor and a second conductor on the substrate and spanning one or more objects on substrate, comprising the steps of:

depositing a layer of PMGI on the substrate;
   depositing a first layer of photoresist over the PMGI layer;
   photolithographically defining a bridge pad region in the first photoresist layer;
   exposing the PMGI layer to deep ultra violet radiation and developing the PMGI layer through the first photoresist layer;
   removing the exposed and developed portions of the PMGI layer and the first photoresist layer, leaving a bridge pad formed on the substrate;
   heating the bridge pad to the transitional temperature of PMGI to round the corners and taper the edges of the pad;
   depositing a layer of PMMA over the substrate and the bridge pad;
   depositing a second layer of photoresist over the PMMA layer;
   photolithographically defining a bridge pattern in the second photoresist layer over the bridge pad;
   exposing the PMMA layer to deep ultra violet radiation and overdeveloping the PMMA layer through the second photoresist layer;
   removing the exposed and overdeveloped portions of the PMMA layer to form a first undercut in the PMMA layer under the second photoresist layer and over at least a portion of the first conductor and to form a second undercut in the PMMA layer under the second photoresist layer and over at least a portion of the second conductor;
   evaporation titanium and gold to deposit a conductive layer over the bridge pad and connecting to the first conductor and to the second conductor; and
   removing the second photoresist layer, the PMMA layer, and the PMGI layer.

2. The method of claim 1, wherein:
   the PMGI layer is established by spinning onto the substrate PMGI at about 4,000 rpm for about 40 seconds, baking the spun on PMGI at about 190° C. for approximately 30 minutes, and repeating the above until approximately 2 microns of PMGI comprise said layer.

3. The method of claim 1, wherein:
   the deep ultra violet radiation applied to the PMGI layer requires about 10 milliwatts per square centimeter at about 248 nanometer for about 10 minutes.

4. The method of claim 1, wherein:
   the deep ultra violet radiation applied to the PMMA layer requires about 10 milliwatts per square centimeter at a wave length of about 248 nanometers for about 5 minutes.

5. The method of claim 1, wherein the step of removing the exposed and developed portions of the PMGI layer and the first photoresist layer further comprises
   removing the first photoresist layer with acetone followed by an isopropyl rinse.

6. The method of claim 1, wherein the step of evaporating titanium and gold to deposit a conductive layer over the bridge pad further comprises mounting the substrate on an evaporation tilt fixture with the long bridge dimension perpendicular to the tilt axis if the bridges are all oriented in the same direction and at 45° to the tilt axis if the bridges are both horizontal and vertical and evaporating the titanium and gold conductive layer using an E-beam source while tilting the substrate through approximately 20° positive and negative angles relative to the beam source.

7. The method of claim 1, wherein the step of heating the bridge pad is done in an oven at about 250° C. for 10-60 seconds.

* * * * *